(12) United States Patent
Yamamoto

(10) Patent No.: US 7,394,317 B2
(45) Date of Patent: Jul. 1, 2008

(54) AMPLIFYING CIRCUIT HAVING BIAS VOLTAGE SETTING MECHANISM

(75) Inventor: Masaki Yamamoto, Fukushima-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 125 days.

(21) Appl. No.: 11/445,828

(22) Filed: Jun. 1, 2006

(65) Prior Publication Data
US 2007/0030072 A1      Feb. 8, 2007

(30) Foreign Application Priority Data
Aug. 4, 2005      (JP) .............................. 2005-226660

(51) Int. Cl.
H03G 3/30      (2006.01)
H03F 1/14      (2006.01)
(52) U.S. Cl. ....................... 330/285; 330/292
(58) Field of Classification Search .............. 330/292, 330/305
See application file for complete search history.

(56) References Cited
U.S. PATENT DOCUMENTS
4,590,613 A * 5/1986 Tannery, IV ............. 455/200.1
4,713,628 A * 12/1987 Nelson ..................... 330/254

FOREIGN PATENT DOCUMENTS
JP      2862560      12/1998
JP      2001-156565   6/2001

* cited by examiner

Primary Examiner—Steven J Mottola
(74) Attorney, Agent, or Firm—Beyer Law Group LLP

(57) ABSTRACT

An amplifying circuit having a bias voltage setting mechanism includes: a first amplifying element that amplifies an input signal and outputs the amplified signal as an output signal; a bias voltage setting unit that generates a bias voltage from the output signal on the basis of a control signal, such as an AGC voltage; and a high impedance element (third resistor) by which the bias voltage is applied to an input portion of the first amplifying element and which, when a component for bias voltage setting, such as a fourth resistor, is externally provided in the bias voltage setting unit, prevents a capacitive component of the component for bias voltage setting from being equivalently connected with respect to the input portion.

5 Claims, 4 Drawing Sheets

US 7,394,317 B2

AMPLIFYING CIRCUIT HAVING BIAS VOLTAGE SETTING MECHANISM

BACKGROUND OF THE INVENTION

1. Field of the Invention

The present invention relates to an amplifying circuit, such as an RF amplifier for a TV tuner, and more particularly, to an amplifying circuit having a bias voltage setting mechanism.

2. Description of the Related Art

FIG. 4 is a circuit diagram illustrating an AGC circuit which is an example of a conventional amplifying circuit.

An AGC circuit 1 shown in FIG. 4 is an amplifying circuit having a gain setting function, which is provided between an antenna tuning circuit 2 and an RF double-tuned circuit 3.

The AGC circuit 1 is a package 1A that is formed by portions surrounded by one-dotted chain line. Within the package 1A, a first amplifying element 4, a second amplifying element 5, a first resistor r1, and a second resistor r2, which are integrally manufactured during a process of manufacturing a semiconductor, are provided.

Each of the first and second amplifying elements 4 and 5 includes a two-gate type MOSFET. An output from the antenna tuning circuit 2 is input as an input signal Vin to a first gate terminal g1 of the first amplifying element 4, and an AGC (automatic gain control) voltage is input to a second gate terminal g2. The second amplifying element 5 is an FET that controls a bias voltage, and a bias voltage Vb that is controlled by the second amplifying element 5 according to a level of the AGC voltage is applied to the first gate terminal g1 of the first amplifying element 4.

The AGC circuit 1 controls an amplification degree according to the intensity of the input signal Vin, that is, a receiving state of an electric wave signal (intensity of an electric field level). Specifically, the AGC circuit 1 decreases the amplification degree when the electric wave signal is strong and increases the electric wave signal when the electric wave signal is weak.

The AGC circuit 1 is disclosed in JP-A-2001-156565, for example.

The AGC circuit 1 is included in a TV tuner, for example. In this case, it may be required that the bias voltage Vb be changed according to the product specifications of a TV tuner. In the AGC circuit 1, the bias voltage Vb is mainly set by a resistance division ratio of the first resistor r1 and the second resistor r2 each having a fixed resistance.

Therefore, in order to externally change the bias voltage Vb, the resistance division ratio of the first resistor r1 and the second resistor r2 needs to be changed. Specifically, it is possible to consider a first method, in which a third resistor r3 is externally provided in parallel to the first resistor r1 outside the package 1A shown in FIG. 4, for example, between an output terminal of the antenna tuning circuit 2 and a ground GND, so as to lower a combined resistance value at the first resistor r1 side, and a second method, in which a fourth resistor r4 is externally provided in parallel to the second resistor r2 outside the package 1A shown in FIG. 4, for example, between the antenna tuning circuit 2 and the RF double-tuned circuit 3 so as to lower a combined resistance value at the second resistor r2 side.

However, when the first and second methods are used, following problems occur.

In the first method, that is, when the third resistor r3 is externally provided in parallel to the first resistor r1, a capacitive component C due to the third resistor r3 or an internal circuit pattern is connected between the output of the antenna tuning circuit 2 and the ground in an equivalent manner, as shown in FIG. 4. Here, since the capacitive component C serves to reduce the variation range of a tuning frequency at the antenna tuning circuit 2, there occurs a problem in that the capacitive component C has an adverse effect on the antenna tuning circuit 2.

Further, even in the second method, that is, even when the fourth resistor r4 is externally provided in parallel to the second resistor r2, since a capacitive component due to the fourth resistor r4 serves to reduce the variation range of the tuning frequency, the capacitive component C also has an adverse effect on the antenna tuning circuit 2 as described above. Furthermore, since input and output terminals of the AGC circuit 1 are connected through the fourth resistor r4 interposed therebetween, a feedback circuit is formed between the input and output terminals of the AGC circuit 1. For this reason, various problems, such as a variation of a wave form or an abnormal oscillation due to the AGC voltage variation according to an increase of a feedback capacitance, occur.

SUMMARY OF THE INVENTION

The invention is designed to solve the above problems, and it is an object of the invention to provide an amplifying circuit having a bias voltage setting mechanism by which a desired bias voltage corresponding to the product specifications can be easily and externally set and which does not have an adverse effect on a circuit.

According to an aspect of the invention, an amplifying circuit having a bias voltage setting mechanism includes: an amplifying element that amplifies an input signal and outputs the amplified signal as an output signal; a bias voltage setting unit that generates a bias voltage from the output signal on the basis of a control signal; and a high impedance element by which the bias voltage is applied to an input portion of the amplifying element and which, when a component for bias voltage setting is externally provided in the bias voltage setting unit, prevents a capacitive component of the component for bias voltage setting from being equivalently connected with respect to the input portion.

In the amplifying circuit having the bias voltage setting mechanism according to the invention, since the high impedance element is provided in a feedback path through which a signal is transmitted from an output side of the amplifying circuit to an input side thereof, it is possible to prevent effects of the capacitive component, which is generated due to an electronic component externally provided at the output side of the amplifying circuit, from being transferred to the input side of the amplifying circuit. As a result, it is possible to prevent the capacitive component from having an adverse effect on an antenna tuning circuit that is provided at the input side of the amplifying circuit.

Further, in the amplifying circuit having the bias voltage setting mechanism, preferably, the amplifying element, the bias voltage setting unit, and the high impedance element are provided within a package.

In the invention, since the amplifying circuit can be made small, the amplifying circuit can be used for various TV tuners.

Furthermore, in the amplifying circuit having the bias voltage setting mechanism, preferably, the amplifying element is a first FET having first and second gate terminals, and the bias voltage setting unit includes: a first resistor whose one end is grounded; a second FET whose source terminal is connected to the other end of the first resistor; and a second resistor connected between a drain terminal of the second FET and an output portion of the amplifying element.

In the invention, it is possible to provide an amplifying circuit that operates reliably.

Furthermore, in the amplifying circuit having the bias voltage setting mechanism, preferably, the high impedance element is a third resistor that is connected between the first gate terminal of the first FET and the drain terminal of the second FET and has a high resistance.

In the invention, even when various resistors are externally provided at the output side of the amplifying circuit, it is possible to reliably prevent the capacitive component due to the resistor from having an effect on the input side of the amplifying circuit.

In addition, in the amplifying circuit having the bias voltage setting mechanism, preferably, at least a first external terminal connected to the first gate terminal of the first FET, a second external terminal connected to a drain terminal of the first FET, a third external terminal connected to a source terminal of the first FET and the one end of the first resistor, a fourth external terminal connected to the second gate terminal of the first FET and a gate terminal of the second FET, a fifth external terminal connected to the drain terminal of the second FET, and a sixth external terminal connected to the source terminal of the second FET are provided around a periphery of the package.

In the invention, it is possible to easily provide an external resistor around the periphery of the package having the amplifying circuit therein. As a result, the bias voltage of the amplifying circuit can be reliably set to a voltage value corresponding to the specifications.

In the amplifying circuit having the bias voltage setting mechanism of the invention, the bias voltage of the amplifying circuit can be reliably set to a desired voltage value only by providing the external resistor around the periphery of the package.

In addition, in the amplifying circuit, since the effects due to the externally-provided resistor can be prevented, it is possible to prevent the variation range of a tuning frequency in an antenna tuning circuit, which is provided at the input side of the amplifying circuit, from being reduced.

DESCRIPTION OF THE PREFERRED EMBODIMENT

Figure 1:
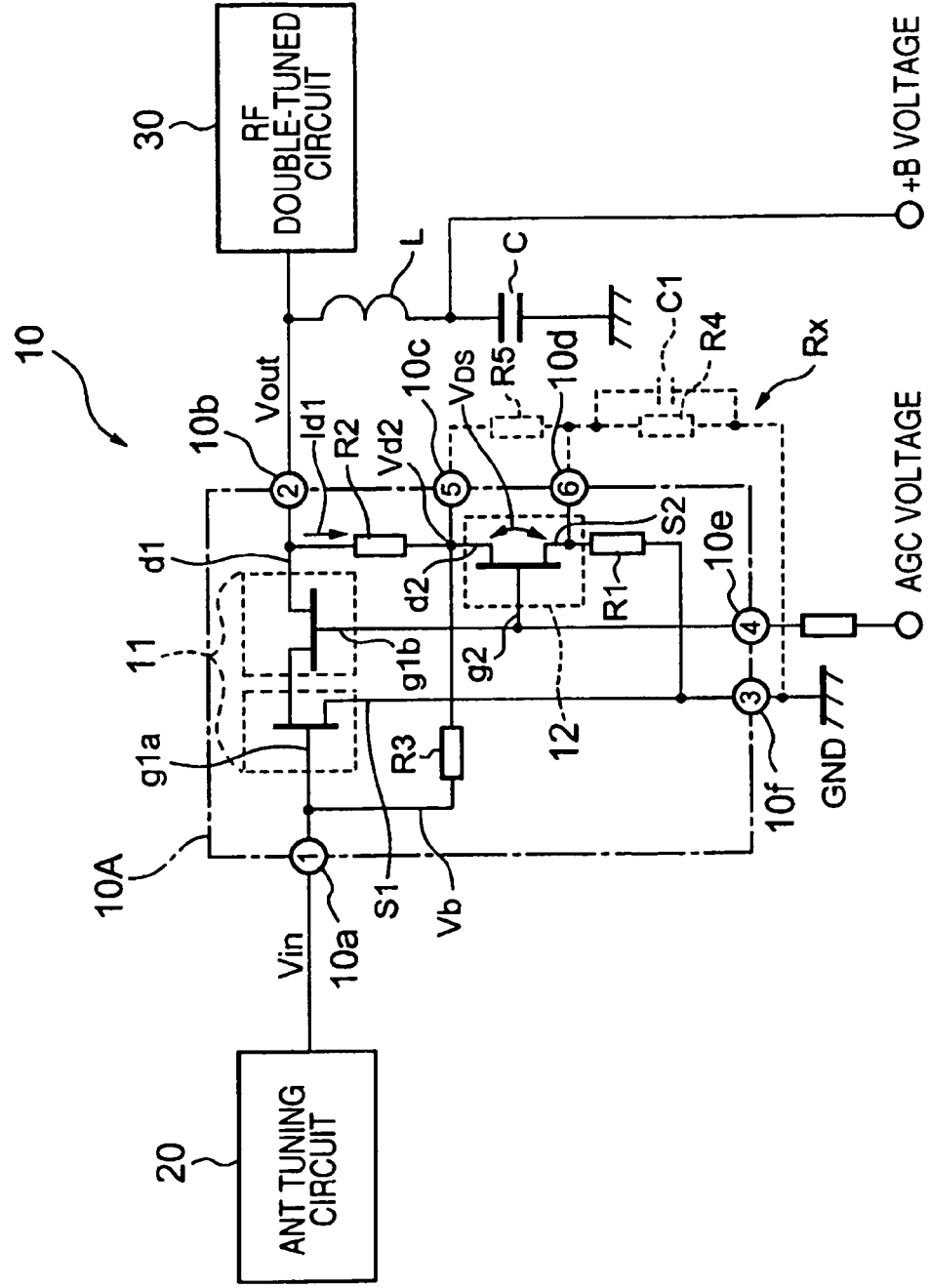
FIG. 1 is a circuit diagram illustrating an amplifying circuit having a bias voltage setting mechanism of the invention.
Figure 2:
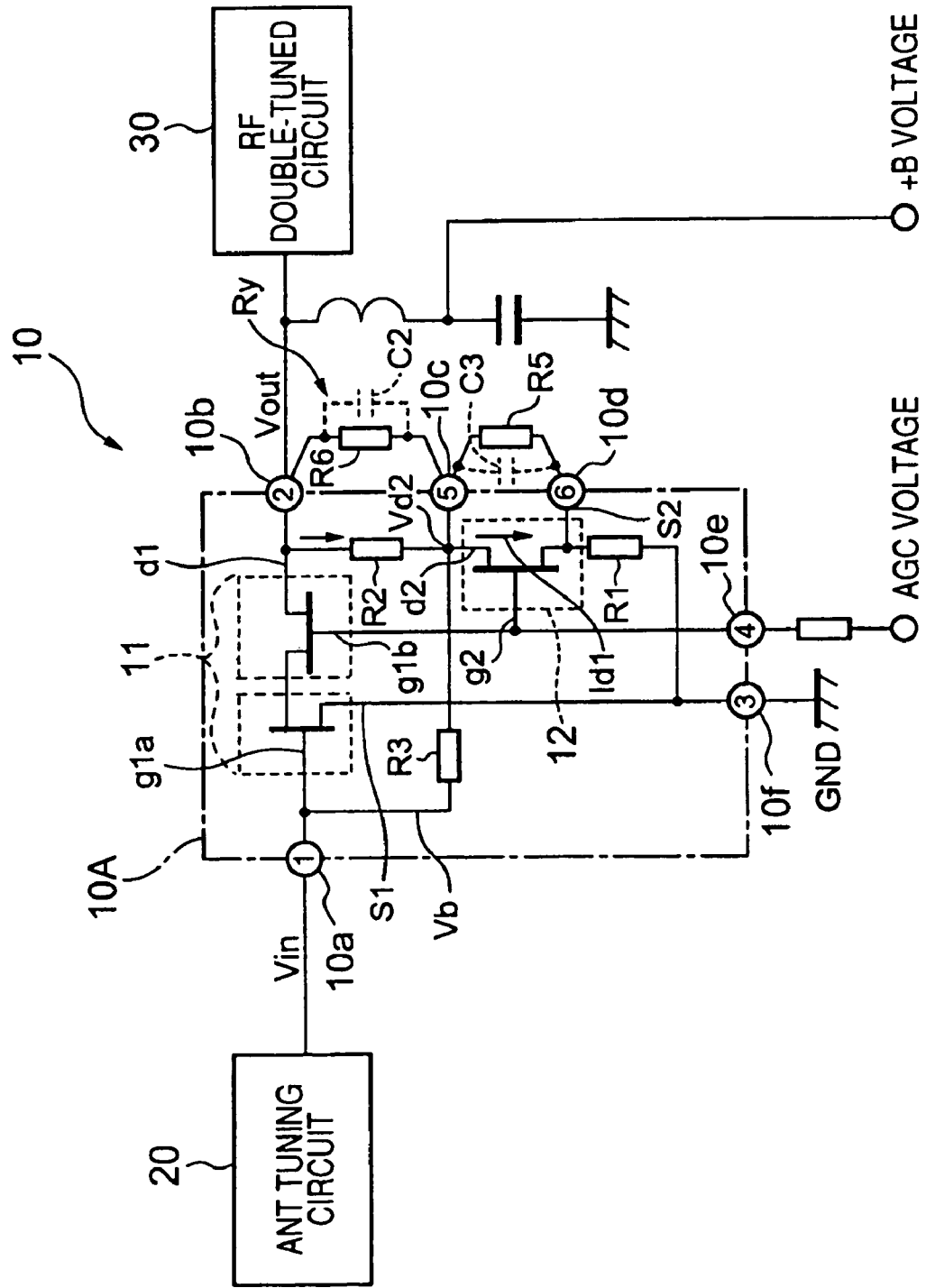
FIG. 2 is a circuit diagram explaining another operation state of an amplifying circuit having a bias voltage setting mechanism, which is similar to that shown in FIG. 1.

FIG. 1 is a circuit diagram illustrating an amplifying circuit having a bias voltage setting mechanism of the invention, and FIG. 2 is a circuit diagram explaining another operation state of an amplifying circuit having a bias voltage setting mechanism, which is similar to that shown in FIG. 1.

Referring to FIG. 1, an AGC (automatic gain control) circuit, which is an example of an amplifying circuit 10, is provided between an antenna (ANT) tuning circuit 20 and an RF double-tuned circuit 30. For example, the AGC circuit is provided in a TV tuner that conforms to the domestic specifications or the overseas specifications.

The amplifying circuit 10 is formed as an integrated package 10A on a silicon substrate by means of a semiconductor manufacturing process of using a layer forming method, such as a sputtering method or an evaporation method. Within the package 10A, a first amplifying element 11, a second amplifying element 12, a first resistor R1, a second resistor R2, and a third resistor R3 (high impedance element) having a high resistance value.

The first amplifying element 11 includes a two-gate type MOSFET having first and second gate terminals g1a and g1b, a drain terminal d1, and a source terminal s1. In addition, the second amplifying element 12 includes a typical (one-gate type) MOSFET having a gate terminal g2, a drain terminal d2, and a source terminal s2.

Further, first to sixth external terminals 10a, 10b, 10c, 10d, 10e, and 10f are provided around the periphery of the package 10A. In addition, each of the terminals of the first and second amplifying elements 11 and 12 is connected to one of the first to sixth external terminals 10a, 10b, 10c, 10d, 10e, and 10f provided around the periphery of the package 10A.

For example, in the first amplifying element 11, the first gate terminal g1a is connected to the first external terminal 10a, the drain terminal d1 is connected to the second external terminal 10b, the source terminal s1 is connected to the third external terminal 10f, and the second gate terminal g1b is connected to the fourth external terminal 10e.

On the other hand, in the second amplifying element 12, the gate terminal g2 is connected to the fourth external terminal 10e together with the second gate terminal g1b of the first amplifying element 11, the drain terminal d2 is connected to the fifth external terminal 10c, and the source terminal s2 is connected to the sixth external terminal 10d.

The first resistor R1 is connected between the source terminal s2 of the second amplifying element 12 and the third external terminal 10f, and the second resistor R2 is connected between the drain terminal d1 of the first amplifying element 11 and the drain terminal d2 of the second amplifying element 12 (between the second external terminal 10b and the fifth external terminal 10c). In addition, the third resistor R3 is connected between the first gate terminal g1a of the first amplifying element 11 and the drain terminal d2 of the second amplifying element 12 (between the first external terminal 10a and the fifth external terminal 10c).

The amplifying circuit 10 constructed as described above is provided between the antenna tuning circuit 20 and the RF double-tuned circuit 30. That is, an output terminal of the antenna tuning circuit 20 is connected to the first external terminal 10a of the amplifying circuit 10, and an input terminal of the RF double-tuned circuit 30 is connected to the second external terminal 10b. In addition, an input signal Vin output from the antenna tuning circuit 20 is input to an input portion of the first amplifying element 11 through the first external terminal 10a, and an output signal Vout that has been amplified is output to the RF double-tuned circuit 30, which is provided at a subsequent stage, through the second external terminal 10b. In addition, the third external terminal 10f is grounded (connected to GND), and an AGC voltage (control voltage) supplied from outside is applied to the fourth external terminal 10e.

An inductor L and a capacitor C, which are connected in series to each other, are provided between the drain terminal d1 of the first amplifying element 11 (second external terminal 10b) and the ground GND, and a +B voltage which is a predetermined power supply voltage is applied to a connected portion between the inductor L and the capacitor C.

Hereinafter, an operation of the amplifying circuit 10 will be described.

The AGC voltage is output from a gain control circuit (not shown) provided at the RF double-tuned circuit 30 side and is then input to the second gate terminal g1b of the first amplifying element 11 and the gate terminal g2 of the second amplifying element 12 through the fourth external terminal 10e of the package 10A.

Here, when the AGC voltage is input to the gate terminal g2 of the second amplifying element 12, a voltage between the drain terminal d2 and the source terminal s2 of the second amplifying element 12 is set to a predetermined drain-source voltage $V_{DS}$ according to the AGC voltage. Assuming that a drain current flowing through the second amplifying element 12 is Id1, a voltage Vd2 at the drain terminal d2 can be set to a value obtained in following equation 1:

$$Vd2 = Id1 \cdot R1 + V_{DS}.$$ [Equation 1]

Further, a voltage Vd2 at the drain terminal d2 of the second amplifying element 12 is applied as a bias voltage Vb (=Vd2) to the first gate terminal g1a of the first amplifying element 11 through the third resistor R3. That is, the first resistor R1, the second amplifying element 12, and the second resistor R2 serve as a bias voltage setting unit.

The predetermined +B voltage is applied to the drain terminal d1 of the first amplifying element 11 through the inductor L. Accordingly, when the input signal Vin is input to the first gate terminal g1a and the AGC voltage is applied to the second gate terminal g1b, the input signal Vin is amplified according to the AGC voltage to be then output as an output signal Vout to the drain terminal d1 of the first amplifying element 11.

Next, a case of decreasing the bias voltage Vb according to the product specifications will be described.

As shown by a dotted line in FIG. 1, in the case of decreasing the bias voltage Vb, a fourth resistor R4 for bias voltage setting is externally provided between the sixth external terminal 10d and the third external terminal 10f which are provided within the package 10A. The fourth resistor R4 is connected in parallel to the first resistor R1. Accordingly, the voltage Vd2 at the drain terminal d2 of the second amplifying element 12 can be set to a value obtained in following equation 1:

$$Vd2 = Id1 \cdot Rx + V_{DS}.$$ [Equation 2]

Here, the Rx is a combined resistor when the first resistor R1 and the fourth resistor R4 are connected in parallel to each other, and the Rx can be expressed in following equation 3:

$$1/Rx = 1/R1 + 1/R4.$$ [Equation 3]

Since the first resistor R1 is larger than the combined resistor Rx, that is, R1>Rx, a voltage drop at the combined resistor Rx is smaller than that at the first resistor R1. For this reason, it is possible to make the output voltage of the second amplifying element 12, that is, the voltage Vd2 at the drain terminal d2 small. As a result, it is possible to make the bias voltage Vb (=Vd2), which is applied to the first gate terminal g1a of the first amplifying element 11 through the third resistor R3, small.

Here, the third resistor R3 has a high resistance value of about several megaohms, for example. Accordingly, it is possible to prevent a capacitive component C1 (shown by a dotted line in FIG. 1), which is generated due to the externally-provided fourth resistor R4, from being equivalently connected with respect to an input portion of the amplifying circuit 10 as described above in the related art. In other words, it is possible to prevent the capacitive component C1 from being connected between the output of the antenna tuning circuit 20 and the ground. At this time, the third resistor R3 having the high resistance value serves as a high impedance element that prevents effects of a capacitive component, which is generated due to an externally-provided resistor (fourth resistor R4), from being transferred to an input side of the amplifying circuit 10.

As such, it is possible to prevent the capacitive component C1 from having an adverse effect on the antenna tuning circuit 20. That is, it is possible to prevent the capacitive component C1 from serving to reduce the variation range of a tuning frequency.

Next, a case of increasing the bias voltage Vb according to the product specifications will be described.

As shown in FIG. 2, in the case of increasing the bias voltage Vb, a sixth resistor R6 for bias voltage setting is externally provided between the second external terminal 10b and the first external terminal 10c which are provided within the package 10A.

That is, since the sixth resistor R6 is connected in parallel to the second resistor R2, a combined resistor Ry between the drain terminal d1 of the first amplifying element 11 and the drain terminal d2 of the second amplifying element 12 becomes small. For this reason, since a total resistance value between the drain terminal d1 of the first amplifying element 11 and the ground GND becomes small, it is possible to increase the drain current Id1 flowing through the second amplifying element 12. Accordingly, since a voltage drop at the first resistor R1 becomes large, the voltage Vd2 at the drain terminal d2 of the second amplifying element 12 can be increased. As a result, it becomes possible to increase the bias voltage Vb (=Vd2) that is applied to the first gate terminal g1a of the first amplifying element 11 through the third resistor R3.

Even in this case, since the third resistor R3 has a high resistance value, it is possible to prevent a capacitive component C2 (shown by a dotted line in FIG. 2), which is generated due to the externally-provided sixth resistor R6, from being equivalently connected with respect to the input portion of the amplifying circuit 10 as described above. Accordingly, it is possible to prevent the capacitive component C2 from having an adverse effect on the antenna tuning circuit 20. That is, it is possible to prevent the capacitive component C2 from serving to reduce the variation range of a tuning frequency.

Figure 3:
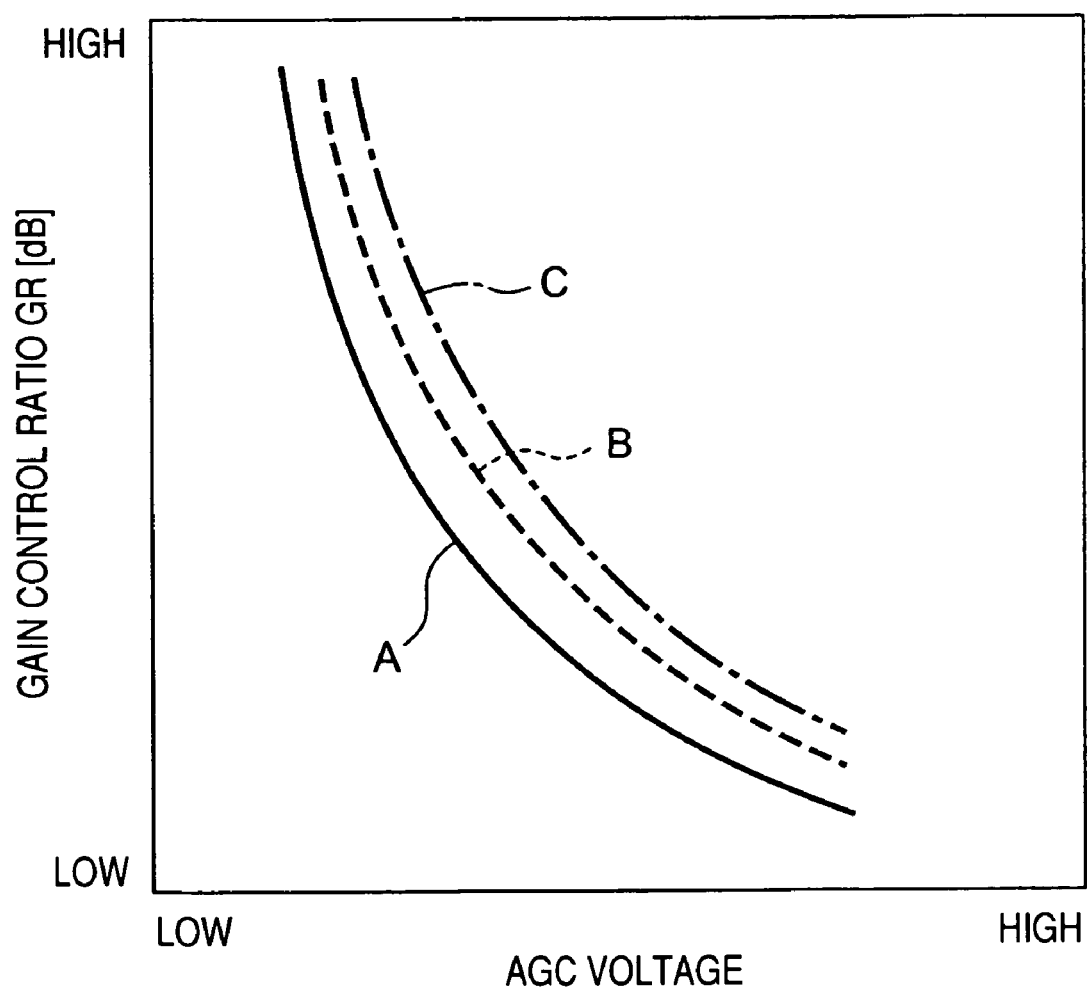
FIG. 3 is a graph illustrating a characteristic of a gain control ratio with respect to an AGC voltage in an amplifying device of the invention.
Figure 4:
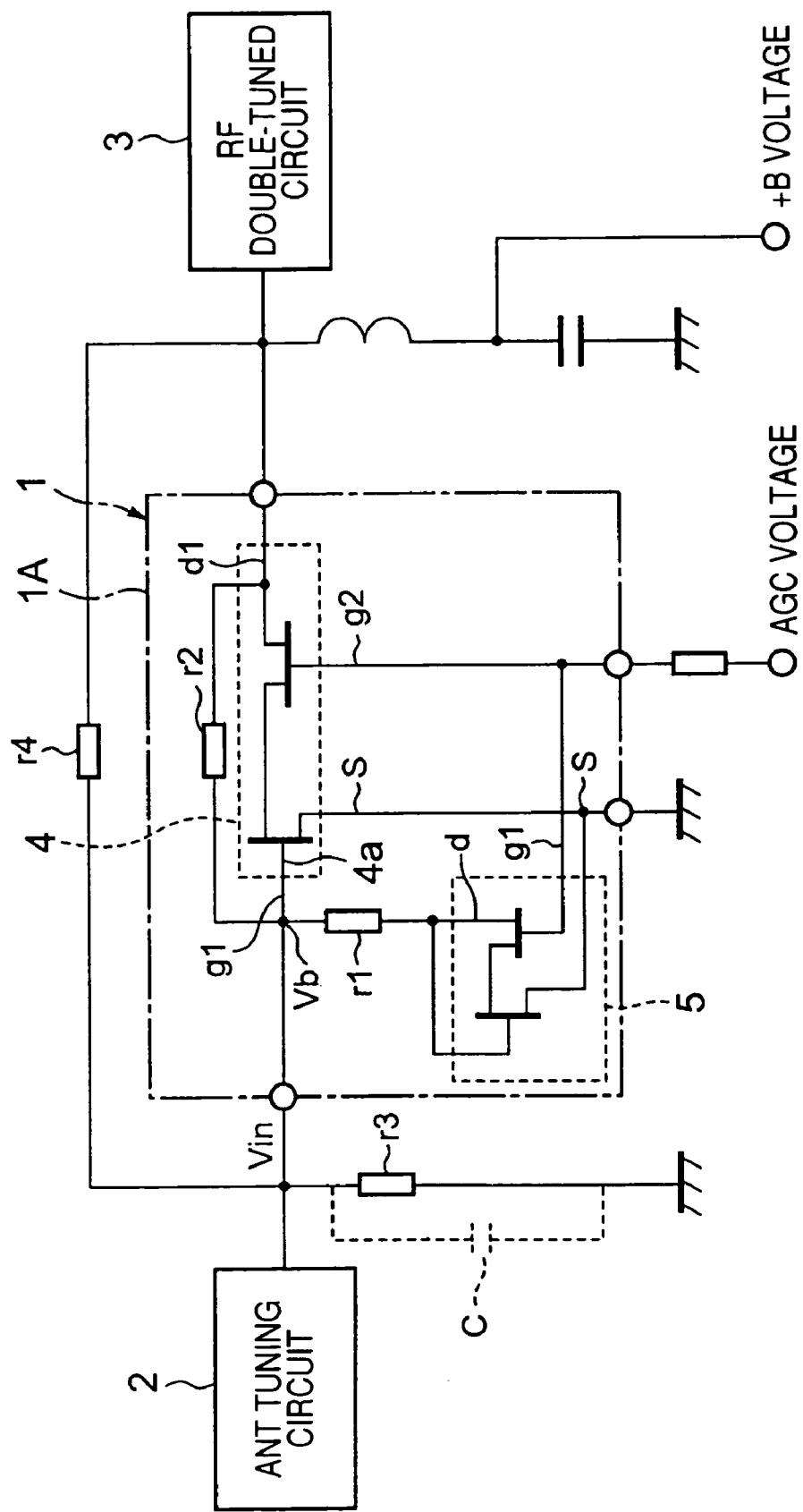
FIG. 4 is a circuit diagram illustrating an AGC circuit which is an example of a conventional amplifying circuit.

FIG. 3 is a graph illustrating a characteristic of a gain control ratio GR with respect to the AGC voltage in an amplifying device of the invention. In FIG. 3, a curve A represents a case in which the fifth resistor R5 (for bias voltage setting) is not provided between the fifth external terminal 10c and the sixth external terminal 10d that are shown in FIGS. 1 and 2, and a curve B represents a case in which the fifth resistor R5 (for bias voltage setting) is provided between the fifth external terminal 10c and the sixth external terminal 10d. In addition, a curve C represents a case in which a resistor, of which a resistance value is different from that corresponding to the curve B, is used as the fifth resistor R5.

As describe above, in the case in which the fifth resistor R5 for bias voltage setting is connected between the fifth external terminal 10c and the sixth external terminal 10d, it is possible to change the characteristic of the gain control ratio GR with respect to the AGC voltage from the curve A in the case when the fifth resistor R5 is not provided to the curve B or the curve C. Accordingly, by properly selecting the fifth resistor R5, the amplifying circuit 10 can have the gain control ratio GR corresponding to the product specifications.

The fifth resistor R5 for bias voltage setting may be solely connected, or may be used in combination with the fourth resistor R4, or may be used in combination with the sixth resistor R6, as necessary. As such, by arbitrarily combining the fourth resistor R4, the fifth resistor R5, and the sixth resistor R6, the gain control ratio GR can have various characteristic curves and it is possible to form the amplifying circuit 10 corresponding to various TV tuners that conform to the domestic specifications or the overseas specifications.

Even in this case, a capacitive component C3, which is generated due to the due to the externally-provided fifth resistor R5, is connected to the output terminal of the antenna tuning circuit 20 through the third resistor R3 having a high resistance. Accordingly, as describe above, it is possible to prevent the capacitive component C3 of the fifth resistor R5 from being equivalently connected between the output terminal of the antenna tuning circuit 20 and the ground GND. As a result, it is possible to prevent the capacitive component C3 from having an adverse effect on the antenna tuning circuit 20. That is, it is possible to prevent the capacitive component C3 from serving to reduce the variation range of a tuning frequency.

The invention claimed is:

1. An amplifying circuit having a bias voltage setting mechanism comprising:
   an amplifying element that amplifies an input signal and outputs the amplified signal as an output signal;
   a bias voltage setting unit that generates a bias voltage from the output signal on the basis of a control signal; and
   a high impedance element by which the bias voltage is applied to an input portion of the amplifying element and which, when a component for bias voltage setting is connected externally to the bias voltage setting unit, prevents a capacitive component of the component for bias voltage setting from being equivalently connected with respect to the input portion.

2. The amplifying circuit having the bias voltage setting mechanism according to claim 1,
   wherein the amplifying element, the bias voltage setting unit, and the high impedance element are provided within a package.

3. The amplifying circuit having the bias voltage setting mechanism according to claim 1,
   wherein the amplifying element is a first FET comprising two FETs In which a drain terminal of an FET having a first game terminal is connected to a source terminal of an FET having a second gate terminal, and
   the bias voltage setting unit includes:
   a first resistor whose one end is grounded;
   a second FET whose source terminal is connected to the other end of the first resistor; and
   a second resistor connected between a drain terminal of the second FET and an output portion of the amplifying element.

4. The amplifying circuit having the bias voltage setting mechanism according to claim 3,
   wherein the high impedance element is a third resistor that is connected between the first gate terminal of the first FET and the drain terminal of the second FET and has a high resistance.

5. The amplifying circuit having the bias voltage setting mechanism according to claim 3,
   wherein at least a first external terminal connected to the first gate terminal of the first FET, a second external terminal connected to a drain terminal of the first FET, a third external terminal connected to a source terminal of the first FET and the one end of the first resistor, a fourth external terminal connected to the second gate terminal of the first FET and a gate terminal of the second FET, a fifth external terminal connected to the drain terminal of the second FET, and a sixth external terminal connected to the source terminal of the second FET are provided around a periphery of the package.

* * * * *